(12) United States Patent
Yang

(10) Patent No.: US 10,032,525 B2
(45) Date of Patent: Jul. 24, 2018

(54) FUSE CIRCUIT, REPAIR CONTROL CIRCUIT, AND SEMICONDUCTOR APPARATUS INCLUDING THE SAME

(71) Applicant: SK hynix Inc., Icheon-si, Geonggi-do (KR)

(72) Inventor: Jong Yeol Yang, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/485,921

(22) Filed: Apr. 12, 2017

(65) Prior Publication Data

US 2018/0102185 A1   Apr. 12, 2018

(30) Foreign Application Priority Data

Oct. 6, 2016   (KR) .................. 10-2016-0129016

(51) Int. Cl.
| G11C 17/00 | (2006.01) |
| G11C 29/00 | (2006.01) |
| G11C 17/16 | (2006.01) |
| G11C 17/18 | (2006.01) |

(52) U.S. Cl.
CPC ............. *G11C 29/78* (2013.01); *G11C 17/16* (2013.01); *G11C 17/18* (2013.01); *G11C 29/76* (2013.01)

(58) Field of Classification Search
CPC ......... G11C 29/78; G11C 29/76; G11C 17/16; G11C 17/18
USPC ...................... 365/96, 200, 189.07
See application file for complete search history.

(56) References Cited

U.S. PATENT DOCUMENTS

| 8,675,431 | B2* | 3/2014 | Iwai .................... G11C 29/702 |
| | | | 365/200 |
| 8,929,165 | B2* | 1/2015 | Son ...................... G11C 29/787 |
| | | | 365/189.07 |
| 9,767,922 | B2* | 9/2017 | Lee ........................ G11C 29/76 |
| 2016/0042805 | A1 | 2/2016 | Park |
| 2016/0111171 | A1* | 4/2016 | Yang ..................... G11C 29/78 |
| | | | 365/96 |

* cited by examiner

*Primary Examiner* — Connie Yoha
(74) *Attorney, Agent, or Firm* — William Park & Associates Ltd.

(57) ABSTRACT

A fuse circuit may include a plurality of first fuse sets and a plurality of second fuse sets. The plurality of first fuse sets may be used to store a defect address detected before packaging of a semiconductor apparatus. The plurality of second fuse sets may be used to store a defect address detected after the packaging. The plurality of first fuse sets may be shared by a plurality of first redundant word lines, and the plurality of second fuse sets may be in one-to-one correspondence with a plurality of second redundant word lines.

20 Claims, 7 Drawing Sheets

FUSE CIRCUIT, REPAIR CONTROL CIRCUIT, AND SEMICONDUCTOR APPARATUS INCLUDING THE SAME

CROSS-REFERENCES TO RELATED APPLICATION

The present application claims priority under 35 U.S.C. § 119(a) to Korean application number 10-2016-0129016 filed on Oct. 6, 2016, in the Korean Intellectual Property Office, which is incorporated herein by reference in its entirety.

BACKGROUND

1. Technical Field

Various embodiments generally relate to a semiconductor circuit, and, more particularly, to a fuse circuit, a repair control circuit, and a semiconductor apparatus including the same.

2. Related Art

In a semiconductor integrated circuit such as a semiconductor memory, defects may occur in memory cells and/or signal lines (e.g., word lines and bit lines) during or after a fabrication process.

In order to repair the defects, the semiconductor integrated circuit may include a circuit that is used to replace defective memory cells with redundant memory cells. For example, rows or columns having defects may be replaced with redundant rows or columns to replace defective memory cells with redundant memory cells.

Furthermore, the semiconductor circuit may include a post package repair (PPR) function, which involves repairing defective memory cells after packaging.

SUMMARY

In an embodiment of the present disclosure, a fuse circuit may include a plurality of first fuse sets and a plurality of second fuse sets. The plurality of first fuse sets may be used to store a defect address detected before packaging of a semiconductor apparatus. The plurality of second fuse sets may be used to store a defect address detected after the packaging. The plurality of first fuse sets may be shared by a plurality of first redundant word lines, and the plurality of second fuse sets may be in one-to-one correspondence with a plurality of second redundant word lines.

In an embodiment of the present disclosure, a repair control circuit may include a fuse array, a fuse latch set array, and a repair determination circuit. The fuse array may include a plurality of first fuse sets and a plurality of second fuse sets. The plurality of first fuse sets may be shared by a plurality of first redundant word lines, and the plurality of second fuse sets may be in one-to-one correspondence with a plurality of second redundant word lines. The fuse latch set array may generate a plurality of flag signal sets indicating whether defect addresses read from the fuse array coincide with an address input from an external device, during a boot-up operation of a semiconductor apparatus. The repair determination circuit may generate a plurality of repair determination signals according to the plurality of flag signal sets, and may prevent a part of the repair determination signals from being activated, according to a normal repair blocking signal.

In an embodiment of the present disclosure, a semiconductor apparatus may include a memory cell array and a repair control circuit. The memory cell array may include a plurality of normal word lines and a plurality of redundant word lines for replacing the plurality of normal word lines. The repair control circuit may include a fuse array having a plurality of first fuse sets and a plurality of second fuse sets. The first fuse sets may be shared by a plurality of first redundant word lines among the plurality of redundant word lines. The plurality of second fuse sets may be in one-to-one correspondence with a plurality of second redundant word lines. The repair control circuit may prevent a repair operation from being performed by the plurality of first fuse sets, when a defect address stored in any one of the plurality of second fuse sets coincides with a defect address stored in any one of the plurality of first fuse sets.

BRIEF DESCRIPTION OF THE DRAWINGS

Features, aspects, and embodiments are described in conjunction with the attached drawings, in which.

DETAILED DESCRIPTION

Hereinafter, a fuse circuit, a repair control circuit and a semiconductor apparatus including the same according to the present disclosure will be described below with reference to the accompanying drawings through exemplary embodiments.

A memory system 100 according to an embodiment may be embodied in the form of a system-in-package module, multi-chip-package module, or system-on-chip module. Alternatively, the memory system 100 may be embodied in the form of a package-on-package module including a plurality of packages.

Figure 1:
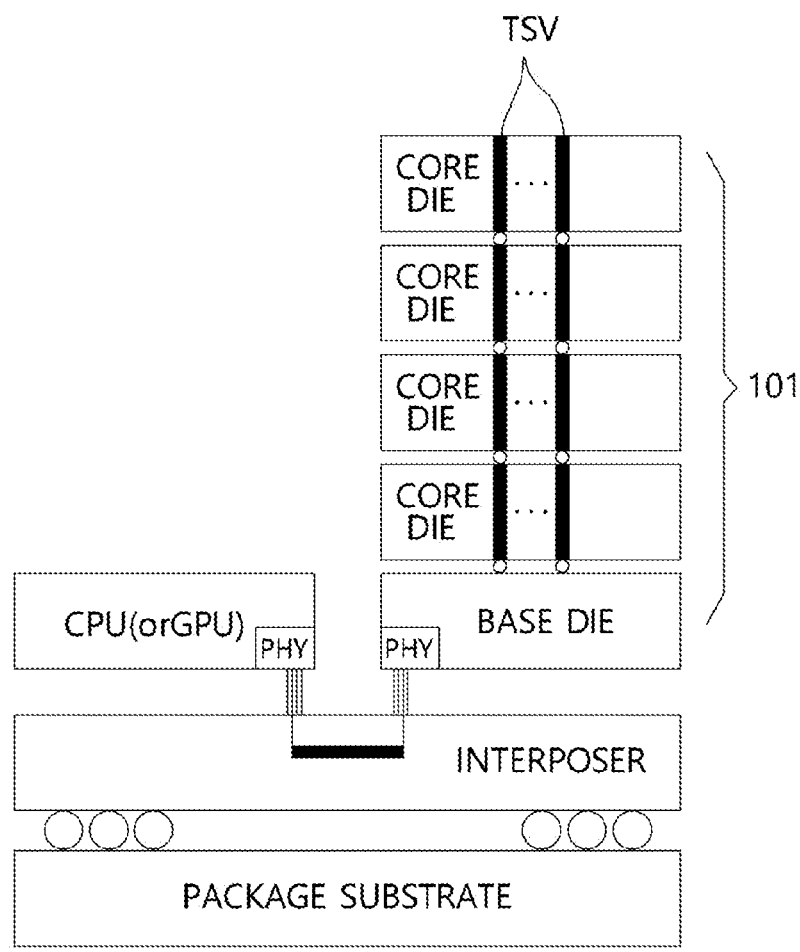
FIG. 1 is a diagram illustrating an example configuration of a memory system according to an embodiment.

As illustrated in FIG. 1, the memory system 100 according to an embodiment may include a semiconductor memory 101, a memory controller CPU or GPU, an interposer, and a package substrate. Here, the semiconductor memory 101 may include a plurality of dies stacked therein.

The semiconductor memory 101 may be configured in the form of a High Bandwidth Memory (HBM) in which a plurality of dies are stacked and electrically coupled to each other through a plurality of through-hole electrodes. The HBM may increase the number of input/output circuits, thereby raising a bandwidth.

The interposer may be coupled to a top portion of the package substrate.

The semiconductor memory 101 and the memory controller CPU or GPU may be coupled to a top portion of the interposer.

Physical regions PHY of the semiconductor memory 101 and the memory controller CPU or GPU may be coupled to each other through the interposer.

The semiconductor memory 101 may include the plurality of stacked dies.

The plurality of stacked dies may include a base die and a plurality of core dies.

The base die and the plurality of core dies may be electrically coupled to each other through a plurality of through-hole electrodes (e.g., TSV: Through Silicon Via).

Figure 2:
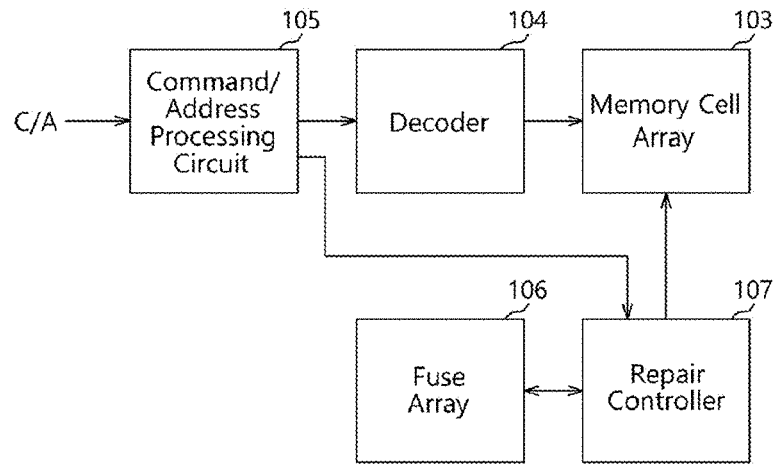
FIG. 2 is a diagram illustrating an example configuration of a semiconductor memory of FIG. 1.

As illustrated in FIG. 2, the semiconductor memory 102, for example, at least one of the base die and the plurality of core dies in FIG. 1 may include a memory cell array 103, a decoder 104, a command/address processing circuit 105, a fuse array 106, and a repair controller 107.

The decoder 104 may decode a row address and column address, and may select a word line and bit line of the memory cell array 103.

The command/address processing circuit 105 may decode a command/address signal C/A input from an external device, and may generate a command related to a normal operation, such as a read command or a write command, or signals related to a boot-up operation and a repair operation, such as a boot-up mode signal Boot and bank active information BK0_ACT and BK1_ACT. Furthermore, the command/address processing circuit 105 may provide a row address and a column address related to a normal operation/repair operation to the decoder 104 or the repair controller 107.

The boot-up mode signal Boot may be activated during a boot-up operation.

The bank active information BK0_ACT and BK1_ACT may include first bank active information BK0_ACT defining an activation of a first memory bank BK0 and second bank active information BK1_ACT defining an activation of a second memory bank BK1.

The fuse array 106 may include a plurality of fuses, and may store addresses of defective memory cells (hereinafter referred to as "defect address"), among memory cells of the memory cell array 103, on a fuse-set by fuse-set basis.

The fuse array 106 may use a plurality of e-fuses in repairing the defect addresses. The e-fuses may store information by performing a program operation even after packaging as well as at a wafer level.

The repair controller 107 may store a defect address detected before or after packaging into the fuse array 106, according to a command (e.g., repair command) generated by the command/address processing circuit 105.

In response to a command such as a boot-up command generated by the command/address processing circuit 105, the repair controller 107 may read defect addresses stored in the fuse array 106, and may store the read addresses therein.

When an address input from an external device coincides with a defect address stored in the repair controller 107, the repair controller 107 may perform a repair operation. For example, the repair controller 107 may select a redundant word line instead of a normal word line of the memory cell array 103.

Figure 3:
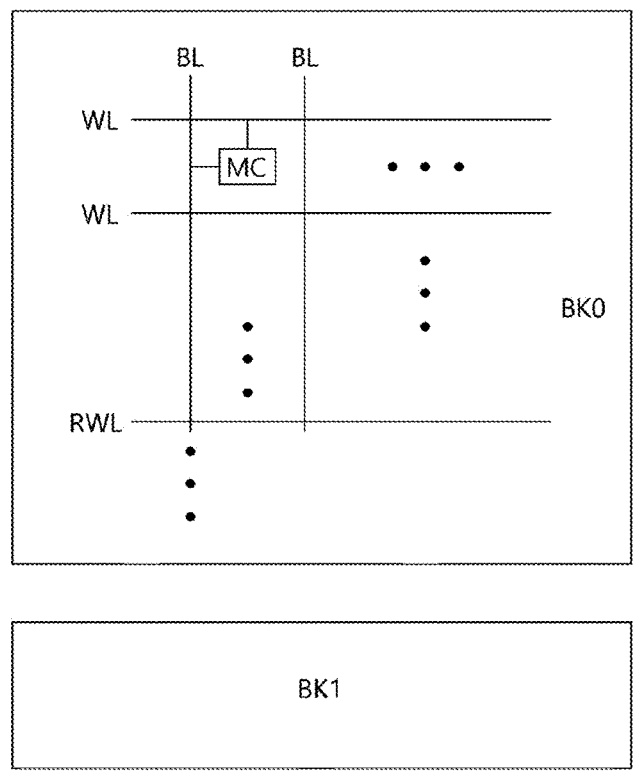
FIG. 3 is a diagram illustrating an example configuration of a memory cell array of FIG. 2.

As illustrated in FIG. 3, the memory cell array 103 may include a plurality of unit memory blocks, for example, a plurality of memory banks BK0 and BK1. Although only two memory banks are illustrated in FIG. 3, three or more memory banks may be present.

The plurality of memory banks BK0 and BK1 may be configured in the same manner.

For example, the first memory bank BK0 may include a plurality of word lines WL and RWL, a plurality of bit lines BL, and a plurality of memory cells MC coupled to the plurality of word lines WL and RWL and the plurality of bit lines BL.

Among the plurality of word lines WL and RWL, WL may represent normal word lines, and RWL may represent redundant word lines for replacing word lines WL corresponding to defect addresses among the plurality of word lines WL.

Figure 4:
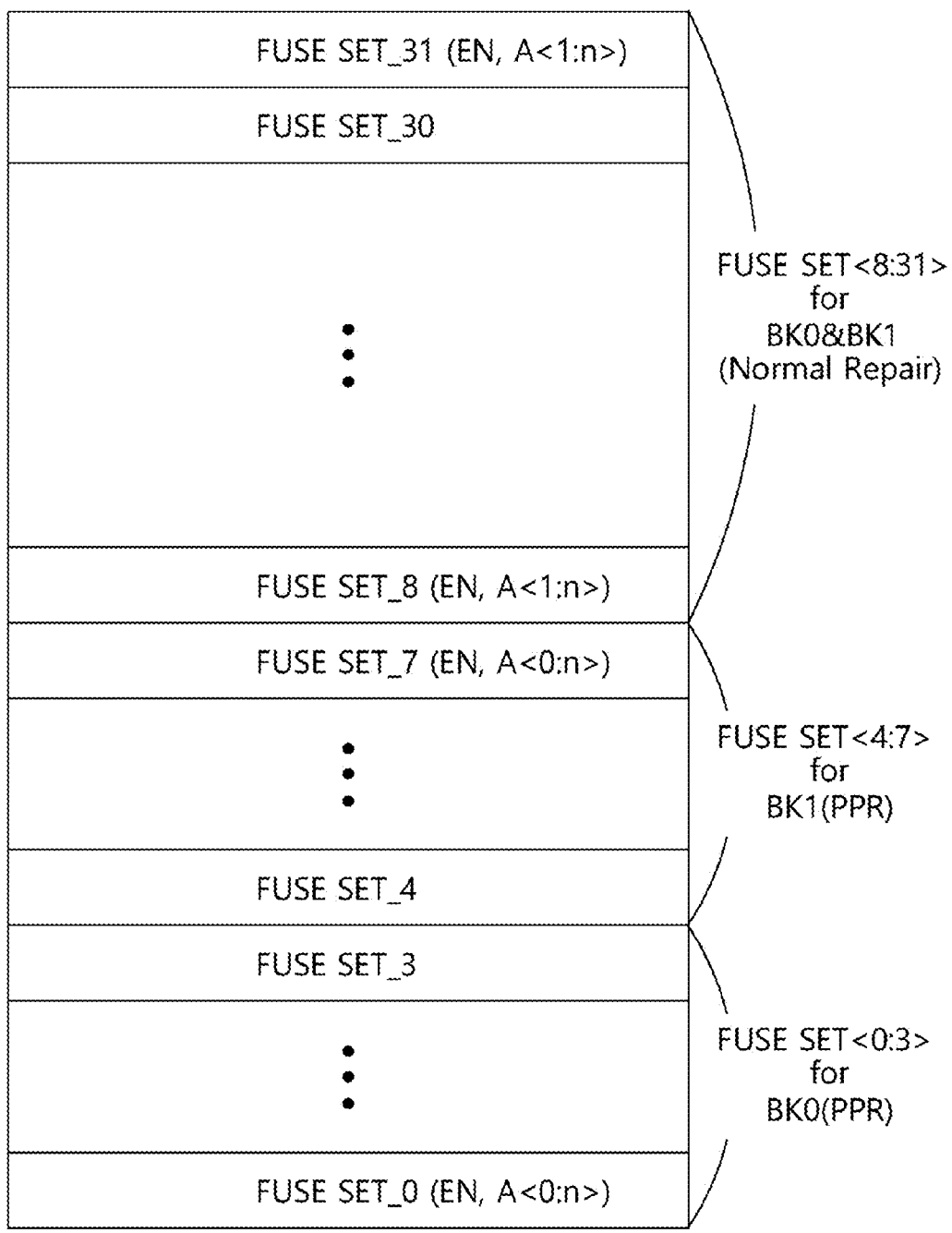
FIG. 4 is a diagram illustrating an example configuration of a fuse array of FIG. 2.

As illustrated in FIG. 4, the fuse array 106 may include a plurality of fuse sets FUSE SET_0 to FUSE SET_31.

Here, the plurality of fuse sets FUSE SET_0 to FUSE SET_31 may correspond to fuse sets allocated to a part of the memory cell array 103.

The fuse sets FUSE SET_0 to FUSE SET_31 may be programmed with different defect addresses.

The plurality of fuse sets FUSE SET_0 to FUSE SET_31 may be divided into first fuse sets FUSE SET_8 to FUSE SET_31 and second fuse sets FUSE SET_0 to FUSE SET_7. Hereafter, the first fuse sets will be referred to as normal repair fuse sets, and the second fuse sets will be referred to as PPR fuse sets. For example, the normal repair fuse sets may be fuse sets that are used to replace defective memory cells before packaging.

The normal repair fuse sets FUSE SET_8 to FUSE SET_31 may be used to store addresses of defective memory cells that have been found to be defective before packaging, for example, during a wafer test process.

The program operation may include rupturing fuses of the fuse sets according to the addresses.

The PPR fuse sets FUSE SET_0 to FUSE SET_7 may be used to store addresses of defective memory cells that have occurred after packaging or have found to be defective after packaging.

The normal repair fuse sets FUSE SET_8 to FUSE SET_31 may be shared by the first memory bank BK0 and the second memory bank BK1. That is, the normal repair fuse sets FUSE SET_8 to FUSE SET_31 may be shared by a plurality of redundant word lines (e.g., four redundant word lines) for replacing a plurality of normal word lines corresponding to different addresses.

For example, four redundant word lines (e.g., RWL0 to RWL3) may be allocated to the normal repair fuse set FUSE SET_31.

The normal repair fuse set FUSE SET_31 may store an address signal A<1:n> and an enable signal EN defining whether the corresponding fuse is used.

Here, since the normal repair fuse sets FUSE SET_8 to FUSE SET_31 are shared by the plurality of normal word lines, the least significant address bit A0 for distinguishing the plurality of normal word lines does not need to be programmed.

During a normal operation, when a defect address programmed in the fuse set FUSE SET_31 is any one of row addresses corresponding to four normal word lines (for convenience, WL0 to WL3), and when a row address input from an external device coincides with the defect address programmed in the normal repair fuse set FUSE SET_31, all of the word lines WL0 to WL3 may be replaced with four redundant word lines RWL0 to RWL3 corresponding thereto.

Unlike the normal repair fuse sets FUSE SET_8 to FUSE SET_31 which are shared by the plurality of normal word lines, the PPR fuse sets FUSE SET_0 to FUSE SET_7 may be in one-to-one correspondence with redundant word lines.

The PPR fuse sets FUSE SET_0 to FUSE SET_7 may be divided into first PPR fuse sets FUSE SET_0 to FUSE SET_3 and second PPR fuse sets FUSE SET_4 to FUSE SET_7.

The first PPR fuse sets FUSE SET_0 to FUSE SET_3 may be in one-to-one correspondence with redundant word lines (for convenience, RWLa to RWLd) for the first memory bank BK0.

The second PPR fuse sets FUSE SET_4 to FUSE SET_7 may be in one-to-one correspondence with redundant word lines (for convenience, RWLe to RWLh) for the second memory bank BK1.

The fuse set FUSE SET_0 may store an address signal A<0:n> and the enable signal EN defining whether the corresponding fuse is used.

Here, since the fuse sets FUSE SET_4 to FUSE SET_7 are in one-to-one correspondence with redundant word lines, the least significant address bit A0 for distinguishing the redundant word lines may be programmed.

When a defect address programmed in the fuse set FUSE SET_0 is a row address corresponding to a normal word line (for convenience, WL4) of the first memory bank BK0, and when a row address input from an external device coincides with the defect address programmed in the fuse set FUSE SET_0, the word line WL4 may be replaced with the corresponding redundant word line RWLa.

When a defect address programmed in the fuse set FUSE SET_4 is a row address corresponding to a normal word line (for convenience, WL8096) of the second memory bank BK1, and when a row address input from an external device coincides with the defect address programmed in the fuse set FUSE SET_4, the word line WL8096 may be replaced with the corresponding redundant word line RWLe.

Figure 5:
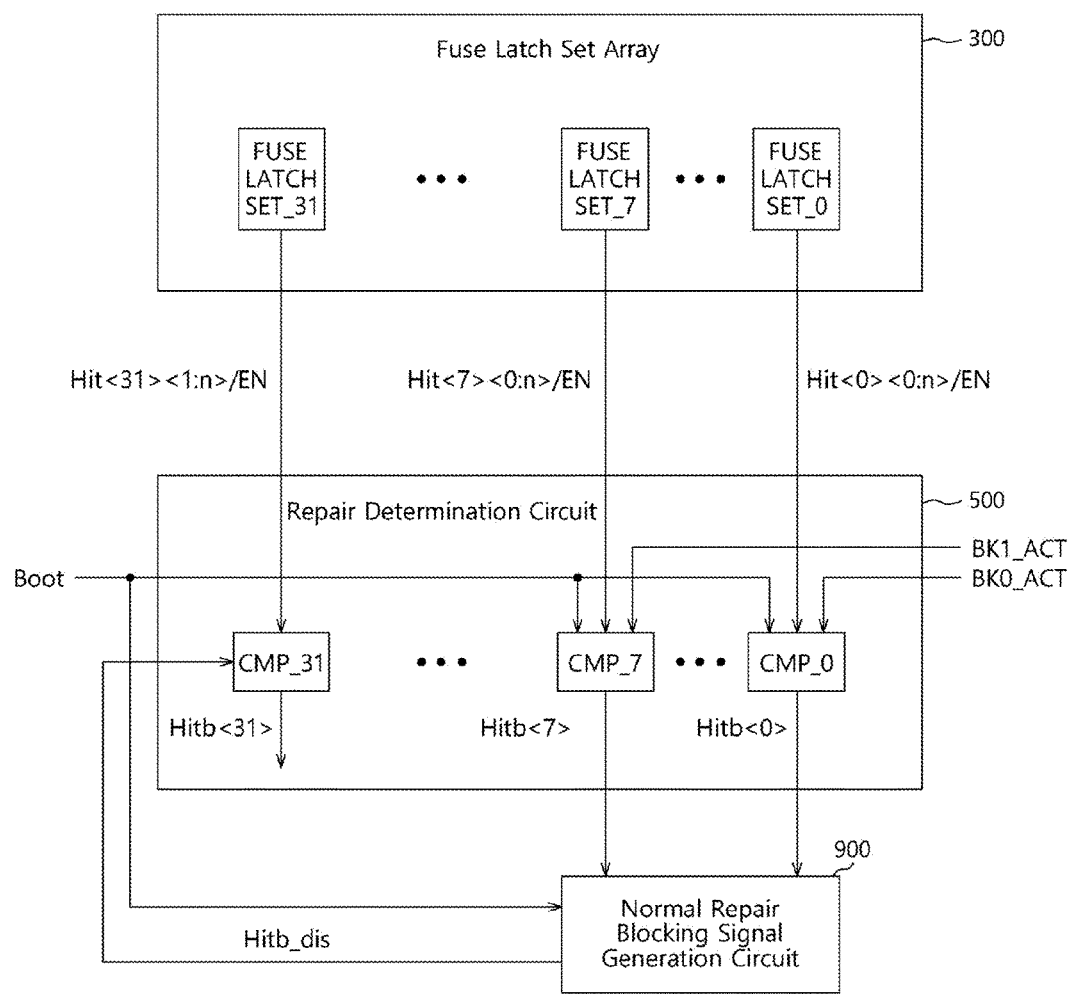
FIG. 5 is a diagram illustrating an example configuration of a repair controller of FIG. 2.

As illustrated in FIG. 5, the repair controller 107 of FIG. 2 may include a fuse latch set array 300, a repair determination circuit 500 and a normal repair blocking signal generation circuit 900.

The fuse latch set array 300 may store defect addresses read from the plurality of fuse sets FUSE SET_0 to FUSE SET_31, during a boot-up operation.

The fuse latch set array 300 may generate a plurality of flag signal sets Hit<8:31><1:n>/EN, Hit<4:7><0:n>/EN and Hit<0:3><0:n>/EN indicating whether defect addresses stored in the fuse latch set array 300 coincide with an address input from an external device, during a normal operation.

The fuse latch set array 300 may include a plurality of fuse latch sets FUSE LATCH SET_0 to FUSE LATCH SET_31.

The plurality of fuse latch sets FUSE LATCH SET_0 to FUSE LATCH SET_31 may be in one-to-one correspondence with the plurality of fuse sets FUSE SET_0 to FUSE SET_31 of FIG. 4.

Among the plurality of fuse latch sets LATCH SET_0 to FUSE LATCH SET_31, the fuse latch sets FUSE LATCH SET_8 to FUSE LATCH SET_31 may correspond to the normal repair fuse sets FUSE SET_8 to FUSE SET_31, the fuse latch sets FUSE LATCH SET_0 to FUSE LATCH SET_3 may correspond to the first PPR fuse sets FUSE SET_0 to FUSE SET_3, and the fuse latch sets FUSE LATCH SET_4 to FUSE LATCH SET_7 may correspond to the second PPR fuse sets FUSE SET_4 to FUSE SET_7.

During a boot-up operation, the plurality of fuse latch sets FUSE LATCH SET_0 to FUSE LATCH SET_31 may store defect addresses read from the plurality of fuse sets FUSE SET_0 to FUSE SET_31.

The repair determination circuit 500 may generate a plurality of repair determination signals Hitb<0:31> according to the boot-up mode signal Boot, the first bank active information BK0_ACT, the second bank active information BK1_ACT and the plurality of flag signal sets Hit<8:31><1:n>/EN, Hit<4:7><0:n>/EN and Hit<0:3><0:n>/EN.

The repair determination circuit 500 may prevent some of the repair determination signals Hitb<0:31> from being activated when a normal repair blocking signal Hitb_dis is activated. For example, the repair determination circuit 500 may prevent the repair determination signals Hitb<8:31> from being activated when a normal repair blocking signal Hitb_dis is activated.

The repair determination circuit 500 may include a plurality of comparators CMP_0 to CMP_31.

Among the plurality of comparators CMP_0 to CMP_31, a plurality of first comparators CMP_8 to CMP_31 may generate first repair determination signals Hitb<8:31> among the plurality of repair determination signals Hitb<0:31>, according to a plurality of first flag signal sets Hit<8:31><1:n>/EN among the plurality of flag signal sets Hit<8:31><1:n>/EN, Hit<4:7><0:n>/EN and Hit<0:3><0:n>/EN.

The plurality of first comparators CMP_8 to CMP_31 may be configured in the same manner.

Among the plurality of comparators CMP_0 to CMP_31, the plurality of first comparators CMP_8 to CMP_31 may prevent the first repair determination signals Hitb<8:31> from being activated when the normal repair blocking signal Hitb_dis is activated.

By using the normal repair blocking signal Hitb_dis, repair operations by the fuse latch sets FUSE LATCH SET_0 to FUSE LATCH SET_7 storing defect addresses of the PPR fuse sets FUSE SET_0 to FUSE SET_7 may have priority over repair operations by the fuse latch sets FUSE LATCH SET_8 to FUSE LATCH SET_31 storing defect addresses of the normal repair fuse sets FUSE SET_8 to FUSE SET_31.

For example, when a defect is detected in a redundant word line corresponding to a row address stored in any one of the fuse latch sets FUSE LATCH SET_8 to FUSE LATCH SET_31, the corresponding address may be programmed to any one of the PPR fuse sets FUSE SET_0 to FUSE SET_7.

In this case, the repair determination signals Hitb<8> and Hitb<0> may be activated at the same time by fuse latch sets storing the same row address, for example, the fuse latch sets FUSE LATCH SET_8 and FUSE LATCH SET_0.

Thus, by using the normal repair blocking signal Hitb_dis, the repair determination circuit 500 may prevent the repair determination signal Hitb<8> from being activated by the fuse latch set FUSE LATCH SET_8, so that the repair determination signal Hitb<0> has priority over the repair determination signal Hitb<8>.

Among the plurality of comparators CMP_0 to CMP_31, the plurality of second comparators CMP_0 to CMP_3 may generate second repair determination signals Hitb<0:3> among the plurality of repair determination signals Hitb<0:31>, according to the boot-up mode signal Boot, the first bank active information BK0_ACT and a plurality of second flag signal sets Hit<0:3><1:n>/EN among the plurality of flag signal sets Hit<8:31><1:n>/EN, Hit<4:7><0:n>/EN and Hit<0:3><0:n>/EN.

The plurality of second comparators CMP_0 to CMP_3 may be configured in the same manner.

Among the plurality of comparators CMP_0 to CMP_31, the plurality of third comparators CMP_4 to CMP_7 may generate third repair determination signals Hitb<4:7> among the plurality of repair determination signals Hitb<0:31>, according to the boot-up mode signal Boot, the second bank active information BK1_ACT and a plurality of third flag signal sets Hit<4:7><1:n>/EN among the plurality of flag signal sets Hit<8:31><1:n>/EN, Hit<4:7><0:n>/EN and Hit<0:3><0:n>/EN.

The plurality of third comparators CMP_4 to CMP_7 may be configured in the same manner.

The normal repair blocking signal generation circuit 900 may generate the normal repair blocking signal Hitb_dis according to the boot-up mode signal Boot and the repair determination signals Hitb<0:7> among the plurality of repair determination signals Hitb<0:31>.

Figure 6:
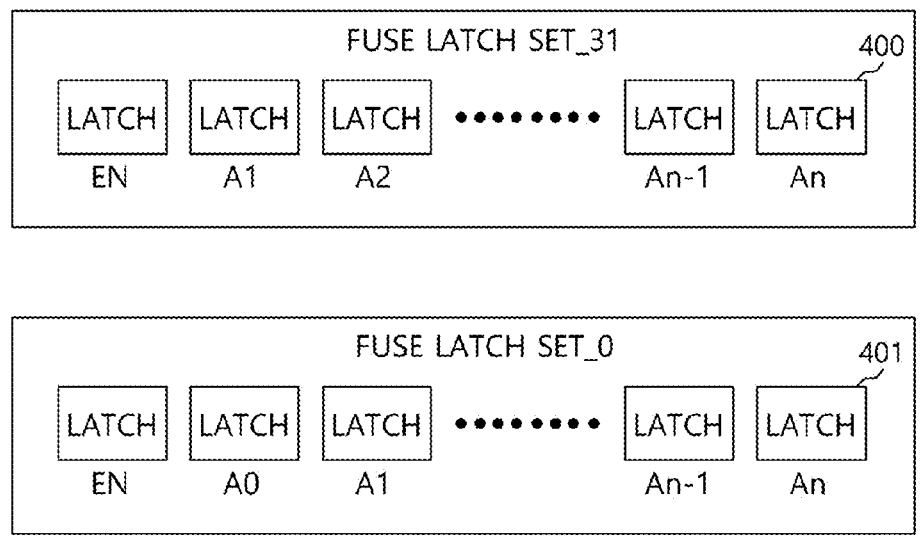
FIG. 6 is a diagram illustrating an example configuration of fuse latch sets of FIG. 5.

As illustrated in FIG. 6, the fuse latch sets FUSE LATCH SET_8 to FUSE LATCH SET_31 may be configured in the same manner. For example, the fuse latch set FUSE LATCH SET_31 may include a plurality of latches 400.

The plurality of latches 400 of the fuse latch set FUSE LATCH SET_31 may store the respective bits of the enable signal EN and the address signal A<1:n>, which are output from the fuse set FUSE SET_31.

As described above, the fuse latch sets FUSE LATCH SET_8 to FUSE LATCH SET_31 may be in one-to-one correspondence with the normal repair fuse sets FUSE SET_8 to FUSE SET_31 shared by the plurality of normal word lines. Thus, the fuse latch sets FUSE LATCH SET_8 to FUSE LATCH SET_31 do not need to store the least significant address bit A0 for distinguishing the plurality of normal word lines.

The fuse latch sets FUSE LATCH SET_0 to FUSE LATCH SET_7 may be configured in the same manner. For example, the fuse latch set FUSE LATCH SET_0 may include a plurality of latches 401.

The plurality of latches 401 of the fuse latch set FUSE LATCH SET_0 may store the respective bits of the enable signal EN and the address signal A<1:n>, which are output from the fuse set FUSE SET_0.

As described above, the fuse latch sets FUSE LATCH SET_0 to FUSE LATCH SET_7 may be in one-to-one correspondence with the PPR fuse sets FUSE SET_0 to FUSE SET_7, which are in one-to-one correspondence with the redundant word lines of the corresponding memory bank. Thus, the fuse latch sets FUSE LATCH SET_0 to FUSE LATCH SET_7 may store the least significant address bit A0 for distinguishing the plurality of normal word lines.

The plurality of latches 400 and 401 may be configured in the same manner.

Figure 7:
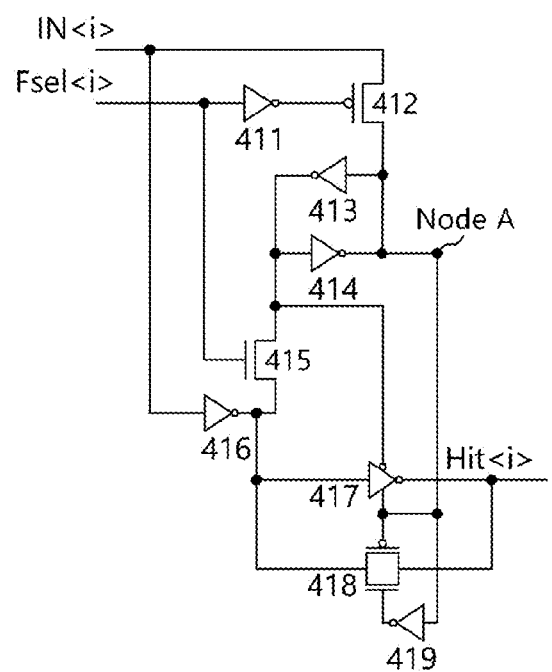
FIG. 7 is a diagram illustrating an example configuration of a latch 400 of FIG. 6.

As illustrated in FIG. 7, the latch 400 may include a plurality of logic gates 411 to 419.

During a boot-up operation, in response to a fuse select signal FSEL<i> activated to a high level, the latch 400 may receive, as an input signal IN<i>, any one of the enable signal EN and the address signal A<1:n> output from the fuse set FUSE_SET_31 and store the input signal IN<i> in a node Node_A.

Then, during a normal operation, the latch 400 may receive one bit of a row address input from an external device as an input signal IN<i>, and activate a flag signal Hit<i> to a high level when the level of the signal stored in the node Node_A coincides with the level of the one bit of the row address.

For example, since the fuse select signal FSEL<i> is at a high level during the boot-up operation, the logic gate 412 may be turned on. When the input signal IN<i> is at a high level, a high level may be stored in the node Node_A through the logic gate 412.

Then, since the fuse select signal FSEL<i> is at a low level during the normal operation, the logic gate 412 may be turned off. Since the node Node_A is at a high level, the logic gate 417 may be turned on. When the input signal IN<i> is at a high level, the flag signal Hit<i> may be activated to a high level through the logic gates 415 and 417.

Since the node Node_A is at the high level as a result of the boot-up operation, the logic gate 417 may stay turned on. Then, since the fuse select signal FSEL<i> is at a low level during the normal operation, the logic gates 412 and 415 may be turned off. When the input signal IN<i> is at a low level, the flag signal Hit<i> may be deactivated to a low level through the logic gates 415 and 417.

For another example, since the fuse select signal FSEL<i> is at a high level during a boot-up operation, the logic gate 412 may be turned on. When the input signal IN<i> is at a low level, a low level may be stored in the node Node_A through the logic gate 412.

Then, since the fuse select signal FSEL<i> is at a low level during a normal operation, the logic gate 412 may be turned off. Since the node Node_A is at a low level, the logic gate 417 may be turned off, and the logic gate 418 may be turned on. When the input signal IN<i> is at a low level, the flag signal Hit<i> may be activated to a high level through the logic gates 416 and 418.

Since the node Node_A is at the low level as a result of the boot-up operation, the logic gate 418 may stay turned on. Then, since the fuse select signal FSEL<i> is at a low level during the normal operation, the logic gates 412 and 415 may be turned off. When the input signal IN<i> is at a high level, the flag signal Hit<i> may be deactivated to a low level through the logic gates 416 and 418.

Figure 8:
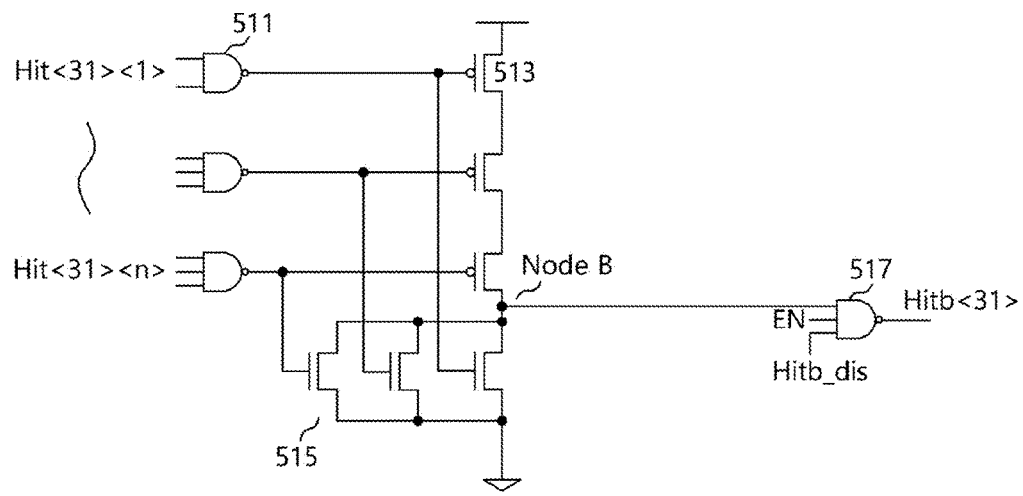
FIGS. 8 to 10 are diagrams illustrating example configurations of comparators of FIG. 5.

As illustrated in FIG. 8, the comparator CMP_31 of FIG. 4 may include a plurality of logic gates 511, 513, 515, and 517.

The logic gates 511 may perform a NAND operation on the flag signal set Hit<31><1:n> and output the result of the NAND operation.

The logic gates 511 may generate a low-level output when the flag signal set Hit<31><1:n> is all activated to a high level.

The logic gates 513 may be coupled between a supply voltage terminal and a ground voltage terminal, and may set the node Node_B to a high level when the outputs of the logic gates 511 are all at a low level.

The logic gates 515 may set the node Node_B to a low level when any one of the outputs of the logic gates 511 is at a high level.

The logic gate 517 may perform a NAND operation on the level of the node Node_B, the enable signal EN, and the normal repair blocking signal Hitb_dis, and may output the result of the NAND operation as the repair determination signal Hitb<31>.

The comparator CMP_31 may activate the repair determination signal Hitb<31> to a low level only when the flag signal set Hit<31><1:n> is all activated to a high level, the enable signal EN is activated to a high level, and the normal repair blocking signal Hitb_dis is deactivated to a high level.

When the normal repair blocking signal Hitb_dis is activated to a low level, the comparator CMP_31 may deactivate the repair determination signal Hitb<31> to a high level, regardless of the other input signals.

Figure 9:
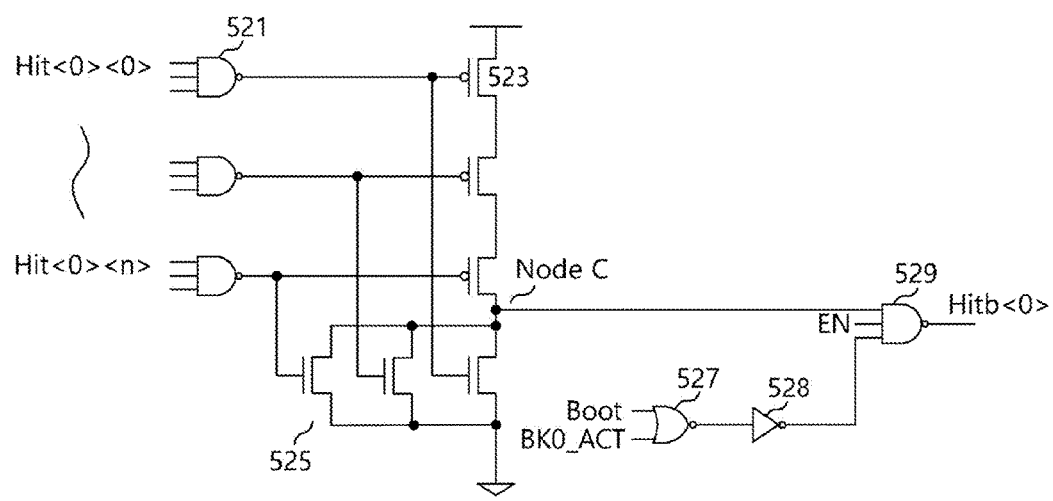

As illustrated in FIG. 9, the comparator CMP_0 of FIG. 4 may include a plurality of logic gates 521, 523, 525, 527, 528, and 529.

The logic gates 521 may perform a NAND operation on the flag signal set Hit<0><0:n> and output the result of the NAND operation.

The logic gates 521 may generate a low-level output when the flag signal set Hit<0><0:n> is all activated to a high level.

The logic gates 523 may be coupled between a supply voltage terminal and a ground voltage terminal, and may set a node Node_C to a high level when the outputs of the logic gates 521 are all at a low level.

The logic gates 525 may set the node Node_C to a low level when any one of the outputs of the logic gates 521 is at a high level.

The logic gates 527 and 528 may perform an OR operation on the boot-up mode signal Boot and the first bank active information BK0_ACT, and may output the result of the OR operation.

The logic gate 529 may perform a NAND operation on the level of the node Node_C, the enable signal EN, and the output of the logic gate 528, and may output the result of the NAND operation as the repair determination signal Hitb<0>.

The comparator CMP_0 may activate the repair determination signal Hitb<0> to a low level only when the flag signal set Hit<0><0:n> is all activated to a high level, the enable signal EN is activated to a high level, and any one of the boot-up mode signal Boot and the first bank active information BK0_ACT is activated.

When the boot-up mode signal Boot and the first bank active information BK0_ACT are all deactivated to a low level, the comparator CMP_31 may deactivate the repair determination signal Hitb<0> to a high level regardless of the other input signals.

That is, where the semiconductor memory is not in the boot-up mode, the comparator CMP_31 may prevent the repair determination signal Hitb<0> from being activated to a low level when the first memory bank BK0 is not enabled.

Figure 10:
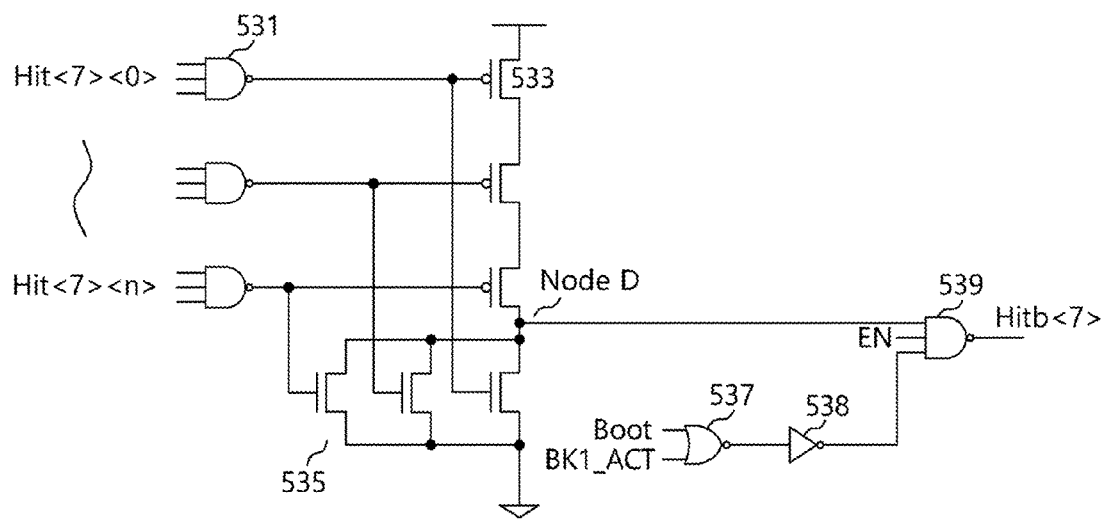

As illustrated in FIG. 10, the comparator CMP_7 of FIG. 4 may include a plurality of logic gates 531, 533, 535, 537, 538, and 539.

The logic gates 531 may perform a NAND operation on the flag signal set Hit<7><0:n> and output the result of the NAND operation.

The logic gates 531 may generate a low-level output when the flag signal set Hit<7><0:n> is all activated to a high level.

The logic gates 533 may be coupled between a supply voltage terminal and a ground voltage terminal, and may set a node Node_D to a high level when the outputs of the logic gates 531 are all at a low level.

The logic gates 535 may set the node Node_D to a low level when any one of the outputs of the logic gates 531 is at a high level.

The logic gates 537 and 538 may perform an OR operation on the boot-up mode signal Boot and the second bank active information BK1_ACT, and may output the operation result.

The logic gate 539 may perform a NAND operation on the level of the node Node_D, the enable signal EN, and the output of the logic gate 538, and may output the result of the NAND operation as the repair determination signal Hitb<7>.

The comparator CMP_7 may activate the repair determination signal Hitb<7> to a low level only when the flag signal set Hit<7><0:n> is all activated to a high level, the enable signal EN is activated to a high level, and any one of the boot-up mode signal Boot and the second bank active information BK1_ACT is activated.

When the boot-up mode signal Boot and the second bank active information BK1_ACT are all deactivated to a low level, the comparator CMP_7 may deactivate the repair determination signal Hitb<7> to a high level regardless of the other input signals.

That is, where the semiconductor memory is not in the boot-up mode, the comparator CMP_7 may prevent the repair determination signal Hitb<7> from being activated to a low level when the second memory bank BK1 is not enabled.

Figure 11:
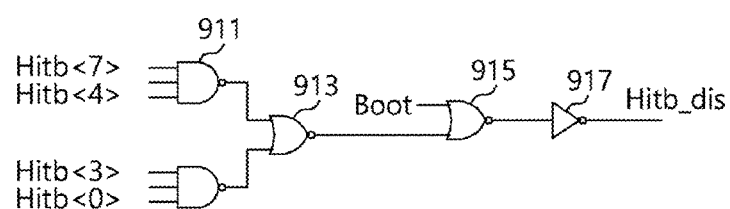
FIG. 11 is a diagram illustrating an example configuration of a normal repair blocking signal generation circuit of FIG. 5.

As illustrated in FIG. 11, the normal repair blocking signal generation circuit 900 may include a plurality of logic gates 911, 913, 915, and 917.

The logic gates 911 may perform a NAND operation on the repair determination signals Hitb<0:7>, and may output the result of the NAND operation.

The logic gate 913 may perform a NOR operation on the outputs of the logic gates 911, and may output the result of the NOR operation.

The logic gates 915 and 917 may perform an OR operation on the output of the logic gate 913 and the boot-up mode signal Boot, and may output the result of the OR operation as the normal repair blocking signal Hitb_dis.

The normal repair blocking signal generation circuit 900 may activate the normal repair blocking signal Hitb_dis when any one of the repair determination signals Hitb<0:7>, which are generated by the fuse latch sets FUSE LATCH SET_0 to FUSE LATCH SET_7 storing the defect addresses of the PPR fuse sets FUSE SET_0 to FUSE SET_7, is activated.

While certain embodiments have been described above, it will be understood to those skilled in the art that the embodiments described are by way of example only. Accordingly, the semiconductor apparatus described herein should not be limited based on the described embodiments. Rather, the semiconductor apparatus described herein should only be limited in light of the claims that follow when taken in conjunction with the above description and accompanying drawings.

What is claimed is:

1. A fuse circuit comprising:
a plurality of first fuse sets for programming a defect address detected before packaging of a semiconductor apparatus; and
a plurality of second fuse sets for programming a defect address detected after the packaging,
wherein the plurality of first fuse sets are shared by a plurality of first redundant word lines of memory banks, a part of the plurality of second fuse sets are in one-to-one correspondence with a plurality of second redundant word lines of each of the memory banks, respectively,
and wherein the plurality of first fuse sets are included in a die of the semiconductor apparatus.

2. The fuse circuit according to claim 1, wherein all signal bits of the defect address, excluding the least significant bit, are programmed to the plurality of first fuse sets.

3. The fuse circuit according to claim 2, wherein all signal bits of the defect address are programmed to the plurality of second fuse sets.

4. The fuse circuit according to claim 1, wherein the second fuse sets are divided into first and second groups, and wherein second fuse sets belonging to the first group are in one-to-one correspondence with a part of the plurality of second redundant word lines positioned in a first memory bank of the memory bank, and second fuse sets belonging to the second group are in one-to-one correspondence with a rest of the plurality of second redundant word lines positioned in a second memory bank of the memory bank.

5. A repair control circuit comprising:
a fuse array comprising a plurality of first fuse sets and a plurality of second fuse sets, the plurality of first fuse sets being shared by a plurality of first redundant word lines of memory banks, the plurality of second fuse sets being in one-to-one correspondence with a plurality of second redundant word lines of each of the memory banks, respectively;

a fuse latch set array configured to generate a plurality of flag signal sets indicating whether defect addresses read from the fuse array coincide with an address input from an external device, during a boot-up operation of a semiconductor apparatus; and a repair determination circuit configured to generate a plurality of repair determination signals according to the plurality of flag signal sets, and prevent a part of the repair determination signals from being activated, according to a normal repair blocking signal, wherein the fuse array is included in a die of a semiconductor apparatus.

6. The repair control circuit according to claim 5, further comprising a normal repair blocking signal generation circuit configured to generate the normal repair blocking signal according to the plurality of repair determination signals.

7. The repair control circuit according to claim 6, wherein when any one signal generated by the second fuse sets, among the plurality of repair determination signals, is activated, the normal repair blocking signal generation circuit activates the normal repair blocking signal.

8. The repair control circuit according to claim 5, wherein all signal bits of the defect address, excluding the least significant bit, are programmed to the plurality of first fuse sets.

9. The repair control circuit according to claim 5, wherein all signal bits of the defect address are programmed to the plurality of second fuse sets.

10. The repair control circuit according to claim 5, wherein the second fuse sets are divided into first and second groups, and wherein second fuse sets belonging to the first group are in one-to-one correspondence with a part of the plurality of second redundant word lines positioned in a first memory bank of the memory banks, and second fuse sets belonging to the second group are in one-to-one correspondence with a rest of the plurality of second redundant word lines positioned in a second memory bank of the memory banks.

11. The repair control circuit according to claim 5, wherein the repair determination circuit generates the plurality of repair determination signals according to a boot-up mode signal, bank active information, and the plurality of flag signal sets.

12. The repair control circuit according to claim 5, wherein, when a defect address stored in any one of the plurality of second fuse sets coincides with a defect address stored in any one of the plurality of first fuse sets, the repair determination circuit prevents a repair determination signal corresponding to any one of the plurality of first fuse sets, among the plurality of repair determination signals, from being activated.

13. The repair control circuit according to claim 5, wherein the repair determination circuit comprises:

a plurality of first comparators configured to generate first repair determination signals, among the plurality of repair determination signals, according to a plurality of first flag signal sets, among the plurality of flag signal sets, and prevents the first repair determination signals from being activated, according to the normal repair blocking signal;

a plurality of second comparators configured to generate second repair determination signals, among the plurality of repair determination signals, according to a plurality of second flag signal sets, among the plurality of flag signal sets, a boot-up mode signal, and first bank active information; and a plurality of third comparators configured to generate third repair determination signals, among the plurality of repair determination signals, according to a plurality of third flag signal sets, among the plurality of flag signal sets, the boot-up mode signal, and second bank active information.

14. A semiconductor apparatus comprising:

a memory cell array, includes memory banks, comprising a plurality of normal word lines and a plurality of redundant word lines for replacing the plurality of normal word lines; and a repair control circuit comprising a fuse array having a plurality of first fuse sets and a plurality of second fuse sets, the first fuse sets being shared by a plurality of first redundant word lines among the plurality of redundant word lines of the memory banks, the second fuse sets being in one-to-one correspondence with a plurality of second redundant word lines of each of the memory banks, respectively, wherein the repair control circuit is configured to prevent a repair operation from being performed by the plurality of first fuse sets, when a defect address stored in any one of the plurality of second fuse sets coincides with a defect address stored in any one of the plurality of first fuse sets, and wherein the fuse array is included a die of the semiconductor apparatus.

15. The semiconductor apparatus according to claim 14, wherein the repair control circuit comprises:

a fuse latch set array configured to generate a plurality of flag signal sets indicating whether defect addresses read from the fuse array coincide with an address inputted from outside, during a boot-up operation of a semiconductor apparatus; and a repair determination circuit configured to generate a plurality of repair determination signals according to the plurality of flag signal sets, and prevent a part of the repair determination signals from being activated, according to a normal repair blocking signal.

16. The semiconductor apparatus according to claim 15, further comprising a normal repair blocking signal generation circuit configured to activate the normal repair blocking signal when any one signal generated by the plurality of second fuse sets, among the plurality of repair determination signals, is activated.

17. The semiconductor apparatus according to claim 15, wherein the repair determination circuit comprises:

a plurality of first comparators configured to generate first repair determination signals, among the plurality of repair determination signals, according to a plurality of first flag signal sets among the plurality of flag signal sets, and prevents the first repair determination signals from being activated, according to the normal repair blocking signal;

a plurality of second comparators configured to generate second repair determination signals, among the plurality of repair determination signals, according to a plurality of second flag signal sets, among the plurality of flag signal sets, a boot-up mode signal, and first bank active information defining an activation of a first memory bank of the memory banks; and a plurality of third comparators configured to generate third repair determination signals, among the plurality of repair determination signals, according to a plurality of third flag signal sets, among the plurality of flag signal sets, the boot-up mode signal, and second bank active information defining an activation of a second memory bank of the memory banks.

18. The semiconductor apparatus according to claim 14, wherein all signal bits of the defect address, excluding the least significant bit, are programmed to the plurality of first fuse sets.

19. The semiconductor apparatus according to claim 14, wherein all signal bits of the defect address are programmed to the plurality of second fuse sets.

20. The semiconductor apparatus according to claim 14, wherein the second fuse sets are divided into first and second groups, and wherein second fuse sets belonging to the first group are in one-to-one correspondence with a part of the plurality of second redundant word lines positioned in a first memory bank of the memory banks, and second fuse sets belonging to the second group are in one-to-one correspondence with a rest of the plurality of second redundant word lines positioned in a second memory bank of the memory banks.

* * * * *

UNITED STATES PATENT AND TRADEMARK OFFICE
CERTIFICATE OF CORRECTION

PATENT NO. : 10,032,525 B2
APPLICATION NO. : 15/485921
DATED : July 24, 2018
INVENTOR(S) : Jong Yeol Yang Page 1 of 1

It is certified that error appears in the above-identified patent and that said Letters Patent is hereby corrected as shown below:

Item (71) Applicant:
Replace "SK hynix Inc., Icheon-si, Geonggi-do (KR)" with --SK hynix Inc., Icheon-si, Gyeonggi-do (KR)--

Signed and Sealed this
Twenty-fifth Day of September, 2018

Andrei Iancu
*Director of the United States Patent and Trademark Office*